United States Patent [19]

Linguet et al.

[11] Patent Number: 5,410,280
[45] Date of Patent: Apr. 25, 1995

[54] PROCESS AND DEVICE FOR AMPLITUDE MODULATION OF A RADIOFREQUENCY SIGNAL

[75] Inventors: Laurent Linguet, Clichy; Philippe de Boisriou, Paris, both of France

[73] Assignee: Thomson-CSF, Paris, France

[21] Appl. No.: 249,637

[22] Filed: May 26, 1994

[30] Foreign Application Priority Data

May 28, 1993 [FR] France ................. 93 06420

[51] Int. Cl.$^6$ .......................... H03C 1/00; H03C 1/50
[52] U.S. Cl. ..................... 332/149; 332/151;
330/10; 455/102; 455/108
[58] Field of Search ............ 332/149, 157, 178;
330/10; 455/102, 108

[56] References Cited

U.S. PATENT DOCUMENTS 3,482,309 12/1969 Bouchard ................ 332/151 X
4,584,541 4/1986 Nossen .
4,835,493 5/1989 Walsh, Jr. .

FOREIGN PATENT DOCUMENTS 0083727 7/1983 European Pat. Off. .

*Primary Examiner*—David Mis
*Attorney, Agent, or Firm*—Oblon, Spivak, McClelland, Maier & Neustadt

[57] ABSTRACT

The process according to the invention consists in breaking down a radiofrequency signal to be modulated according to a first and second signal, representing respectively the sum of the output voltages of identical amplitude of a first and second determined number of modules, with which respectively a first and second vector are associated whose respective amplitude and phase verify that the vectorial sum of the two vectors coincides with a determined reference that is used as a phase reference of the two vectors, in adapting the phase of the load impedance of each module so that vector associated with the current supplied by each of the amplifying modules is in phase delay in relation to their output voltages, in modulating the phase of the two signals by the modulation signal and in adding the first and second phase modulated signal to obtain a resultant amplitude modulated signal. Application: Medium wave radio broadcast transmitters.

8 Claims, 3 Drawing Sheets

PROCESS AND DEVICE FOR AMPLITUDE MODULATION OF A RADIOFREQUENCY SIGNAL

BACKGROUND OF THE INVENTION

1. Field of the Invention

This invention relates to a process and a device for amplitude modulation of a radiofrequency signal.

It is applied in particular to medium wave radiobroadcast transmitters comprising power modules having field-effect transistors or, in English, MOSFET-type transistors.

2. Description of the Prior Art

With the advent of power transistors, easy to control and with short switching times therefore able to operate at frequencies from several hundred kilohertz to a megahertz or more, the costly, bulky electron-tube transmitters requiring very high voltage power supplies and of difficult maintenance tend to be replaced with transmitters whose amplifier stages use these types of transistors. These transmitters are generally composed of power modules or elementary amplifiers, assembled in parallel or in series so as to transmit the required power. The usual structure of these modules is of the "H"-bridge type also called "complete bridge." Currently, there are several solutions for amplitude modulation of the output signal of these transmitters. One is described by patent application No. 2,567,338 titled "Amplifier having amplifying stages that can be switched as a function of the amplitude of the signal to be amplified" filed in France in the name of the applicant.

This solution is relatively simple to use and does not require any special management of the operating of the elementary modules. Nevertheless, it requires a great deal of self inductances and capacitors designed for large voltages and circuits, as well as transformers with many secondaries, this is therefore a bulky costly solution of mediocre efficiency.

Another solution comprising a digital management of the modules makes possible an improvement in the efficiency but at the cost of a great complexity of managing the modules. In this case, the constitution of the envelope of the wave transmitted is performed by superposition of the signal provided by each of the power modules supplied with the same voltage E and whose operation is controlled by the digital part. However, to refine the envelope of the signal to be transmitted, it is necessary to use additional power modules supplied with voltage E/2, E/4 . . . E/2p. This constitutes a major drawback since all the elementary modules are no longer identical and thus eliminates the total interchangeability of these modules. This also does not make possible an operating mode at degraded or reduced power, since the disconnecting of at least one module, as a result of any failure, causes distortions of the transmitted wave in contrast with a solution composed of interchangeable modules whose stopping of one or the other causes only a reduction of emitted power, now, quite often in certain cases of figures, such an operating mode can be satisfactory for use.

Further, this solution requires many sources of different voltages and the continual switchings of the modules produce disturbing spurious signals. It should be noted moreover that the lack of total interchangeability of the modules causes additional difficulty and cost for maintenance and development.

The object of the invention is to eliminate said drawbacks.

SUMMARY OF THE INVENTION

For this purpose, the invention has as its object a process for amplitude modulation of a signal, of the type consisting in modulating a radiofrequency output signal of a determined number of amplifying modules having transistors, by a modulation signal, said process consisting in breaking down the radiofrequency signal to be modulated according to at least a first and second signal, representing respectively the sum of the output voltages of identical respective amplitudes of a first and second determined number of modules, with which a first and second vector are associated whose respective phases and amplitudes verify that the vectorial sum of the two vectors coincides with a determined reference that is used as a phase reference of the two vectors, and in modulating the respective phases of the two signals by the modulation signal and in adding the first and second phase modulated signal to obtain a resultant amplitude modulated signal.

The invention has as its main advantages that it makes it possible for all the amplifying modules of the transmitter to operate in a single blocking switching mode. This makes it possible no longer to generate losses due to the troublesome MOSFET output capacities in starting switching mode and therefore to improve the overall efficiency of the transmitter. The invention makes possible, on the other hand, a great flexibility in the control of the output power, a better accuracy of the amplitude of the output signal as a function of the modulation signal at the input of the transmitter. It further makes possible an easy maintenance and an operating mode in degraded power.

BRIEF DESCRIPTION OF THE DRAWINGS

Other characteristics and advantages of the invention will appear more clearly from the following description made with regard to the accompanying drawings which represent.

MORE DETAILED DESCRIPTION

Figure 1:
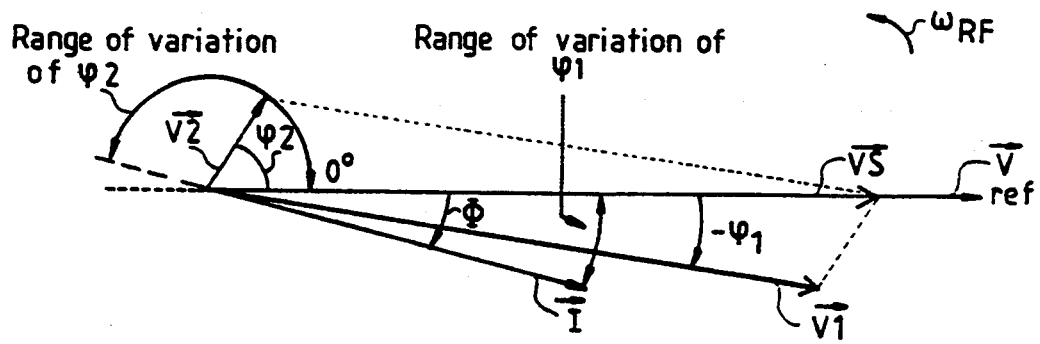
FIG. 1, a Fresnel vectorial diagram, illustrating the principle of the process according to the invention, FIG. 2, a configuration of an elementary amplifying module, FIG. 3, an embodiment of a device for using the process according to the invention.

FIG. 1 illustrates the basic principle of the process according to the invention.

In this figure the vectors $\vec{V}_1$ and $\vec{V}_2$ constitute a vectorial representation according to the Fresnel method of two sinusoidal signals of the same frequency f and phase-shifted respectively by an angle $\phi_1$ and $\phi_2$ determined in relation to a determined reference signal $V_{ref}$ of the same frequency f.

The amplitude of vectors $\vec{V}_1$ and $\vec{V}_2$ can be different. Their respective amplitude is noted $E_1$ and $E_2$. A function of the time of the first signal and of the second signal that are associated respectively with vectors $\vec{V}_1$ and $\vec{V}_2$ can be noted:

$$V_1(t) = E_1 \cos(2\pi ft - \phi_1) \quad (1)$$

and $$V_2(t) = E_2 \cos(2\pi ft + \phi_2) \quad (2)$$

where t represents time, $E_1$, $E_2$, $\phi_1$ and $\phi_2$ said amplitudes and phases.

Vectors $\vec{V}_1$ and $\vec{V}_2$ are associated respectively with the sum of the output voltages, of a first and second determined number of elementary amplifying modules defining respectively a first and second group of amplifying modules. The modules are identical and the output voltages of each module of the same group are identical. Amplitudes $E_1$ and $E_2$ represent respectively the sum of the amplitudes of the output voltages of each module of the first and second group of modules.

The values of amplitudes $E_1$ and $E_2$ and of phases $\phi_1$ and $\phi_2$ of the two signals $V_1(t)$ and $V_2(t)$ are determined so that sum signal $V_S$ of the two signals $V_1(t)$ and $V_2(t)$ associated with the vectorial sum $\vec{V}_S$ of the two vectors $\vec{V}_1$ and $\vec{V}_2$ respectively associated with signals $V_1(t)$ and $V_2(t)$, are in phase with a determined reference signal with which vector $\vec{V}_{ref}$ is associated.

The maximum amplitude of the sum signal $V_S$ is then expressed according to the following expression:

$$|V_S| = E_1 \cos \phi_1 + E_2 \cos \phi_2 \quad (3)$$

The amplitude modulation of the sum signal $V_S$ is therefore achieved by acting on all or part of the four respective parameters with amplitudes $E_1$, $E_2$ and with phases $\phi_1$ and $\phi_2$ of the two signals $V_1(t)$ and $V_2(t)$.

On the other hand, the load impedance Z to which the amplifying modules supply is adapted so that the load current I of all the modules is always delayed by phase $\phi$ in relation to their output voltage $\vec{V}_1$ or $\vec{V}_2$.

These operating conditions make it possible for the transistors to operate in a single blocking switching mode and thus make it possible to overcome the presence of a series diode with the MOSFET transistors necessary in the case of a start switching and which generates losses. The process according to the invention therefore makes it possible to improve the overall efficiency of the transmitter.

The process according to the invention consists finally in adding the two signals $\vec{V}_1$ and $\vec{V}_2$ to obtain an amplitude modulated signal $V_S(t)$ acting on the amplitude and phase parameters of each signal $\vec{V}_1$ and $\vec{V}_2$.

Figure 2:
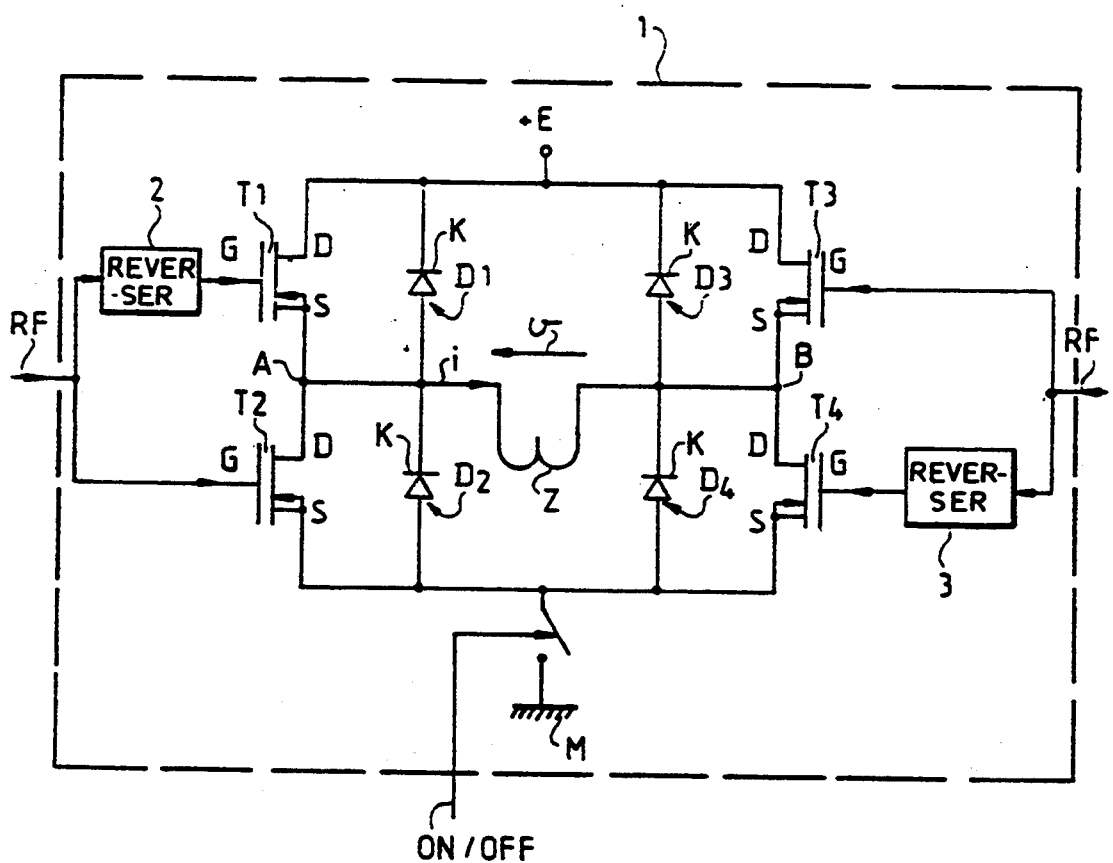

An example of elementary amplifying module 1 used by the process according to the invention is illustrated by FIG. 2.

A symmetrical bridge structure forming an "H" comprises two pairs of identical MOSFET transistors, $T_1$ to $T_4$, each operating under switching conditions. Each MOSFET, $T_1$ to $T_4$, behaves as an active switch.

Each pair of transistors comprises respectively a first and second transistor in series $T_1$, $T_2$ and $T_3$, $T_4$. Source S of the first transistor of each pair $T_1$, $T_3$ being coupled to drain D of the second $T_2$, $T_4$. The continuous supply of determined amplitude E is applied to drains D of the first two MOSFET's, $T_1$ and $T_3$, of each pair and the circuit thus produced is reclosed on a ground potential M by an ON/OFF control symbolized by a switch, serving as potential reference, by the sources of the second MOSFET transistors, $T_2$ and $T_4$, of each pair. Diodes, $D_1$ to $D_4$, are mounted in parallel respectively on each MOSFET transistor, $T_1$ to $T_4$, between their respective drain D and source S. Cathode K is coupled to drain D and the anode to source S.

Output signal v of the "H" bridge is delivered between the output of each pair of transistors $T_1$, $T_2$ and $T_3$, $T_4$, i.e., between the common points between source S and drain D of the two pairs of transistors $T_1$, $T_2$ and $T_3$, $T_4$, represented respectively by points A and B. The bridge supplies a current i into a determined load impedance Z represented in the form of a transformer primary. Each transistor $T_1$ to $T_4$ receives a control signal RF on its grid G. One of the two transistors $T_1$, $T_2$ and $T_3$, $T_4$ of each pair receives control signal RF directly and the other transistor receives the same signal but reversed by a reversing circuit 2 and 3, produced for example from a transformer whose coil of the winding of the secondary on the side of the transistor is reversed in relation to the winding of the primary receiving control signal RF. On the other hand, the first transistors $T_1$ and $T_3$ of each pair receive respectively the same control signal but reversed, likewise for the second transistors of each pair $T_2$ and $T_4$.

Figure 3:
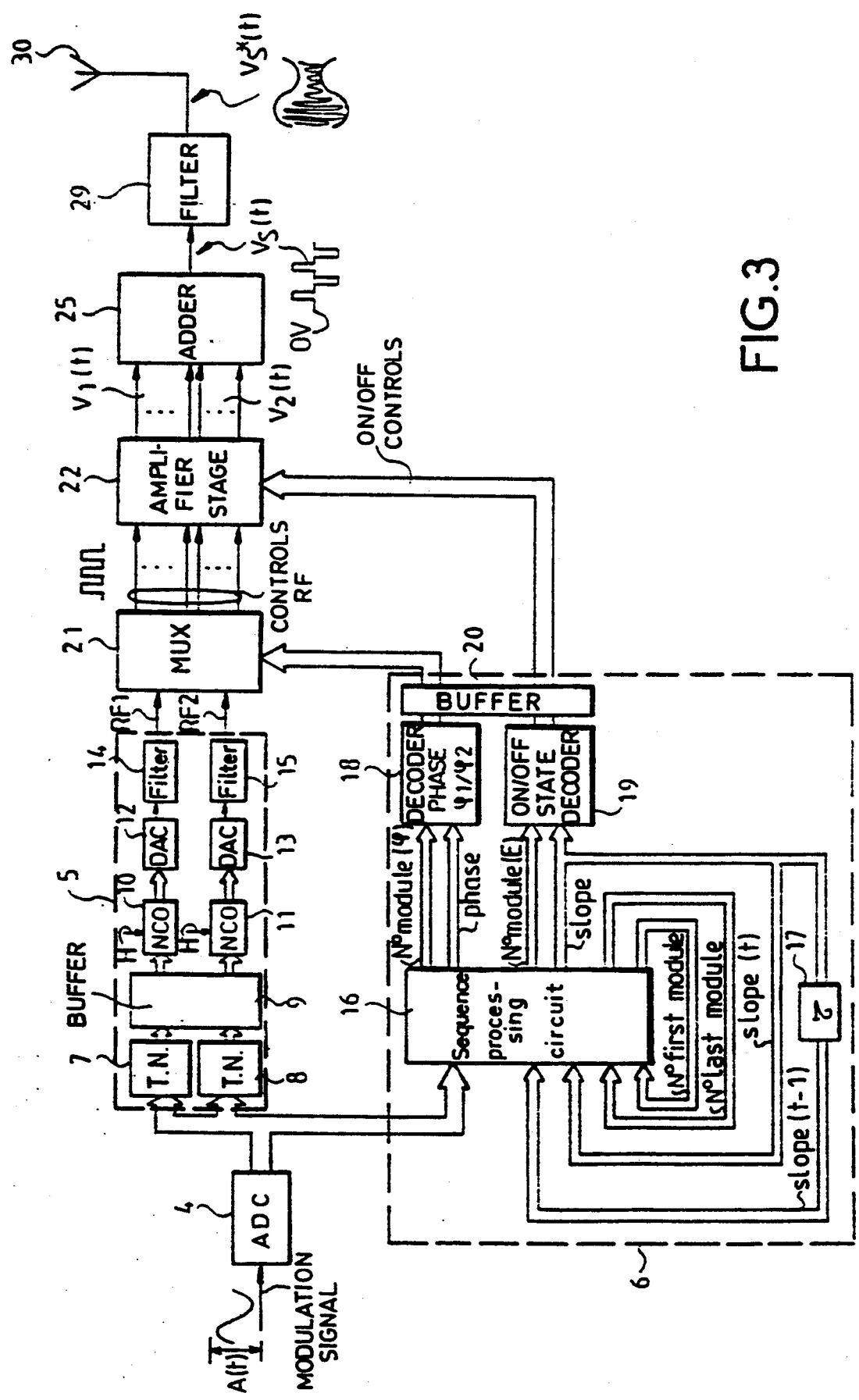

A device for using the process according to the invention is represented by FIG. 3.

This device comprises an analog-to-digital converter 4 known by the abbreviation ADC receiving on its input a modulation signal A(t), any audiofrequency signal for example, whose maximum amplitude is known and is used to calibrate the device. A shape of modulation signal A(t) is represented in FIG. 3. ADC 4 delivers on its output the digitally converted modulation signal. The conversion frequency is equal to a determined transmission frequency f or to one of its multiple frequencies. The output of ADC 4 is coupled, respectively, to the two inputs of a control generating stage 5 and to the input of management means 6.

Control generating stage 5 comprises from the input to the output, a first circuit 7 and a second circuit 8 for digital processing, designated by the initials T.N. in FIG. 3, each receiving on their input the digitally converted modulation signal. Each digital processing circuit 7 and 8 generates respectively a determined phase shift $\phi_1$ and $\phi_2$ as a function of the amplitude of modulation signal A(t). The variation in amplitude of the modulation signal A(t) as a function of time conditions a predetermined law of variation of the parameters of amplitude $E_1$ and $E_2$ and of phase $\phi_1$ and $\phi_2$ of output signals $V_1(t)$ and $V_2(t)$ of the amplifying modules. The parameters can themselves also be defined by a predetermined function of time, all of these predetermined functions having to obey the law of variation imposed by the variation of the amplitude of the modulation signal to be able to recreate the modulation signal.

Modulation signal A(t) can be recreated from determined functions of the parameters of amplitude and phase of the output signals of the amplifying modules and can be expressed, for example, by the following formula:

$$A(t) = f_3(t) \cos f_1(t) + f_2(t) \cos f_4(t) \quad (4)$$

with for example:
$f_3(t) = E_1$, $f_1(t) = \phi_1$, $f_2(t) = E_2$
and $f_4(t) = \phi_2$ where $f_1(t)$ to $f_4(t)$ are constants.

The various functions $f_1(t)$ to $f_4(t)$ can also take into account different criteria established by the user such as for example, the number of modules used, the maximum phase shift $\phi$ of load impedance Z, etc.

The output of each digital processing circuit 7 and 8 therefore delivers respectively a determined phase shift value $\phi_1$ and $\phi_2$ deduced from a law and from predetermined functions, of the type for example of relation (4), as a function of the variation of the amplitude of modulation signal A(t). The digital processing circuits 7 and 8 can be produced for example by means of memories having tables of logic circuits that can be programmed by the user. The phase shift values $\phi_1$ and $\phi_2$, or phase modulation data items, are applied to the input of a first buffer register 9 that synchronizes the modulation data items with one another.

They are then injected respectively onto the input of a first and second numerically controlled oscillator NCO, 10 and 11. Each NCO 10 and 11 delivers, from the same determined clock signal H, a periodic digital signal varying sinusoidally at the same frequency as the transmission frequency f of the signal to be modulated, and whose phase varies according to the modulation data item present at their input.

The output of each NCO 10 and 11 is coupled respectively to the input of a digital-to-analog converter or DAC, 12 and 13, and the analog signals delivered at the output of each DAC, 12 and 13, are filtered respectively by a filter 14 and 15, for example of the Butterworth type. Control generating stage 5 therefore delivers two signals of the same frequency equal to the transmission frequency f that constitute respectively a first and second control signal RF1 and RF2 of the MOSFET transistors of a first determined number N1 of modules 1 whose sum of the output signals $V_1(t)$ is phase-shifted by $-\phi_1$ and of a second determined number N2 of modules 1 whose sum of the output signals $V_2(t)$ is phase-shifted by $+\phi_2$ by going back to the case represented in FIG. 1.

Management means 6 receive on their input, corresponding also to a first input of a sequence processing circuit 16, the modulation signal converted digitally by ADC 4. This circuit 16 is produced for example from a memory that can be programmed by the user.

Modulation signal A(t) is broken down by sequence processing circuit 16 into a determined number of sequences treated in the same way as horizontal bands that are juxtaposed to recreate modulation signal A(t). Each sequence corresponds to a portion of modulation signal A(t) taken between the two determined consecutive moments.

The level information can, for example, be determined from high-order bits of the binary word reflecting a determined amplitude of modulation signal A(t) at a determined moment.

Sequence processing circuit 16, also determines the direction of variation, or slope, of modulation signal A(t) by comparing the modulation data item between two consecutive sequences, namely between two determined consecutive decision moments, t−1 and t, a change of slope being reflected by a change of state of a bit of determined sign.

At each decision moment, sequence processing circuit 16 transmits a change of state of one or more determined modules as well as the phase to be applied to these modules as a function of the amplitude level and of the slope of modulation signal A(t).

Sequence processing circuit 16 delivers at output a determined number of information items that are reinjected on its input:
a first information item corresponds to the identification of the first module activated in case of an increase of the modulation signal or of the first module deactivated in case of a decrease of the modulation signal,
a second information item corresponds to the identification of the last module activated before a change of slope of the modulation signal, and
a third and fourth information item correspond respectively to the slope of the modulation signal at the current moment t and the slope of the modulation signal at the preceding moment t−1, the two moments t and t−1 being separated by a delay $\tau$ 17.

Sequence processing circuit 16 further determines the various associations between signals RF1, RF2 generated by control generating stage 5 and one or more modules determined as a function of the predetermined law established by the variation of the amplitude of modulation signal A(t) of the type of formula (4). It also makes possible a distribution of the activated modules to make the overall heat dissipation uniform over all the amplifying modules.

To do this, it delivers on its output a first pair of respective information items for identification of the elected module, and for the phase to be applied on this module. Also, it delivers on its output a second pair of respective information items for identification of the elected module and for the slope of modulation signal A(t).

The first and second pairs of information items are injected respectively at the input of a phase decoder 18 and of an ON/OFF state decoder 19.

Phase decoder 18 receives a first control word identifying the determined module, coded for example on six bits, and receives a control for selection of phase $\phi_1$ or $\phi_2$ to be applied to this module, coded on one bit, state "0" for $\phi_1$ and state "1" for $\phi_2$, for example. It makes it possible to transcribe the information items received into a multiplexing control signal.

ON/OFF state decoder 19 makes it possible to transcribe the identification of a determined module and the slope of the modulation signal at the decision moment into an activation order ON or a non-activation order OFF of this module. The information items coming from the two decoders 18 and 19 are synchronized by a buffer circuit 20, then are injected respectively on a first input of a multiplexer MUX 21 and on an amplifier stage 22.

Multiplexer 21 establishes the various connections between control signals RF1, RF2 and the elected modules of amplifier stage 22. The shape of control signals RF1 and RF2 is illustrated in FIG. 3.

Figure 4:
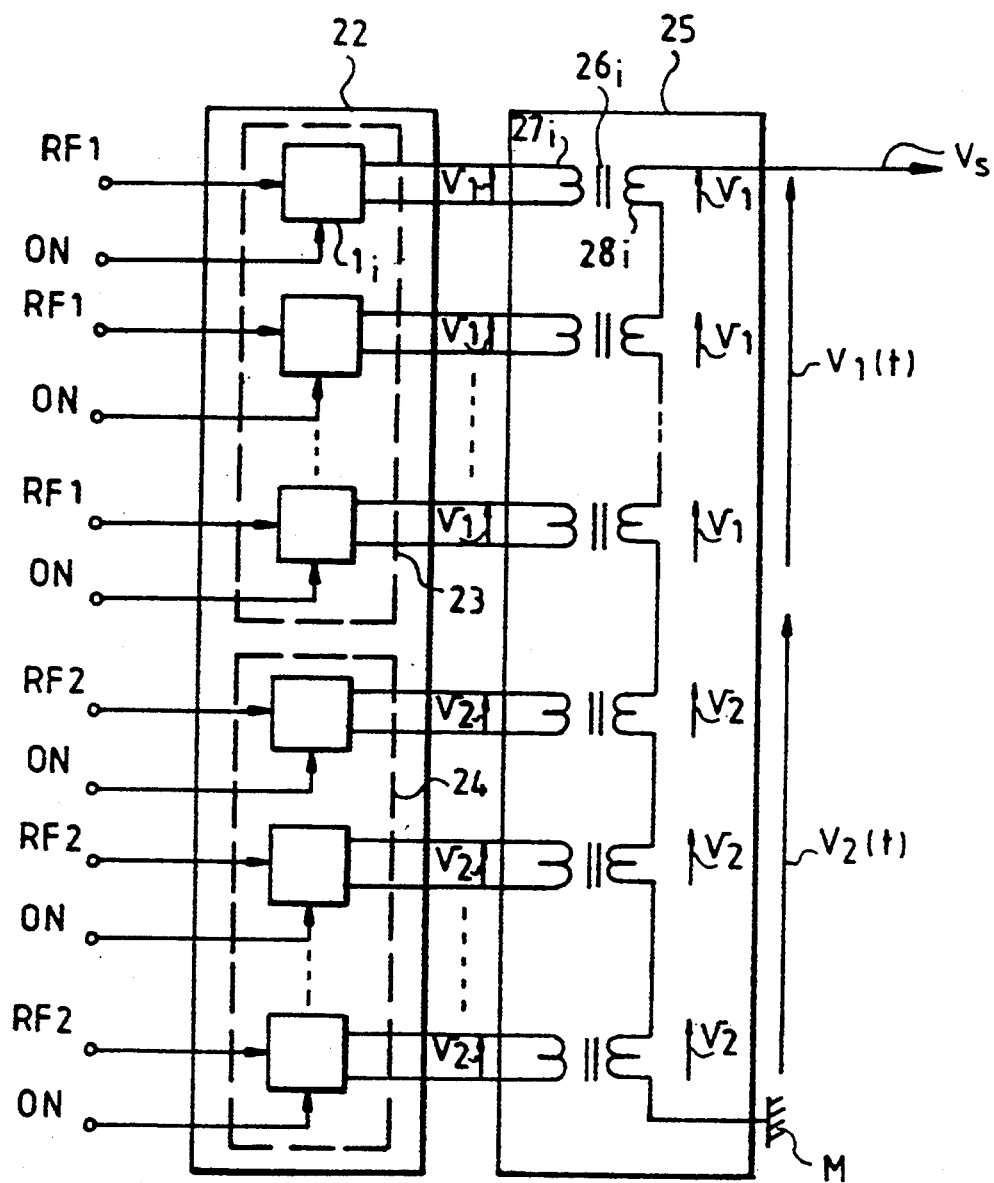
FIG. 4, shows the amplifier stage of FIG. 3 and a distribution of control signals RF1 and RF2 among the modules 1.

FIG. 4 represents an example of distribution of controls RF1 and RF2 on a first and second group 23 and 24 of modules 1$i$, of the type illustrated by FIG. 2, of amplifier stage 22. Each module 1$i$ of the first and second group 23 and 24 of modules is activated by a first activation control ON and by a second control, RF1 for the first group 23 of modules and RF2 for the second group 24 of modules. Each module 1$i$ of each group 23 and 24 delivers respectively on its output a voltage $v_1(t)$ and a voltage $v_2(t)$.

Voltages $v_1(t)$ and $v_2(t)$ are added by an adder 25 made, for example, from transformers 26$i$ with a transformer ratio equal to one. Each transformer 26$i$ receives on its primary 27$i$ voltage $v_1(t)$ or $v_2(t)$ which is then collected at the terminals of the secondary 28$i$ of transformer 26$i$. The secondaries 28$i$ of all the transformers 26$i$ are wired in series and reclosed, by a first end, on a ground potential M serving as reference potential, and deliver on a second end the signal $V_S(t)$ consisting of the sum of voltages $v_1(t)$ and voltages $v_2(t)$.

Output signal $V_S(t)$ of adder 25 is injected at the input of a low-pass filer 29 that also serves as an impedance adaptor represented in FIG. 3.

Output signal $V_S(t)$ is a square-wave signal comprising square waves that are symmetrical in relation to a voltage of 0V whose shape is represented in FIG. 3. Filter 29 restores on its output a signal $V_S^*(t)$ corresponding to the main, or fundamental, harmonic of signal $V_S(t)$. A variation of the width of the square waves and of their amplitude is reflected at the output of filter 29 by a variation in the amplitude of signal $V_S^*(t)$, the envelope of signal $V_S^*(t)$ corresponding to modulation signal $A(t)$. Signal $V_S^*(t)$ is then transmitted to a radiofrequency transmission antenna 30.

The device according to the invention therefore makes it possible to amplitude modulate a radiofrequency signal by phase modulating the output signals of the two groups 23 and 24 of modules.

The good choice of amplitude and phase-shift values of the output voltages of the amplifying modules as well as the phase of the load impedance of the modules makes it possible to impose a current supplied by each module always in phase delay on the output voltage of each module.

A variant of the invention consists in dissociating the controls RF of the pairs of transistors $T_1$, $T_2$ and $T_3$, $T_4$ of amplifying modules 1. Signal RF is broken down, for example, into a first signal RF1 and into a second signal RF2. The same amplifying module is thus broken down into two amplifying modules each consisting of a half bridge.

The invention is not limited to the preceding exact description. The number of groups of amplifying modules is not limited to two, and the use of more than two groups of modules does not go outside the scope of the invention if the conditions imposed on the phase shifting and the amplitude of the vectors associated with the output signals of the modules as well as on the load impedance are respected.

What is claimed is:

1. Process for amplitude modulation of a signal, of the type consisting in modulating a radiofrequency output signal of a determined number of amplifying modules having transistors, by a modulation signal, said process consisting in breaking down the radiofrequency signal to be modulated according to at least a first and second signal, representing respectively the sum of the output voltages of identical respective amplitudes of a first and second determined number of modules, with which respectively a first and second vector are associated whose respective amplitudes and phases verify that the vectorial sum of the two vectors coincides with a determined reference that is used as a phase reference of the two vectors, and in modulating the respective phases of the two signals by the modulation signal and in adding the first and second phase modulated signal to obtain, after filtering, a resultant amplitude modulated signal.

2. Process according to claim 1, wherein it consists further in adapting the phase of the load impedance of each module so that the vector associated with the current supplied by each of the amplifying modules is in phase delay in relation to their output voltages.

3. Device for using the process according to any one of claims 1 and 2, wherein amplifying means, means for generating controls for phase modulation as a function of the amplitude of modulation signal on amplifying means, management means to manage the controls for phase and amplitude modulation of amplifying means as a function of the amplitude of modulation signal, means for distributing the phase and amplitude modulation control signals on amplifying means as a function of the controls coming from management means, means for adding the output signals of amplifying means and, filtering means to obtain at output an amplitude modulated radiofrequency signal.

4. Device according to claim 3, wherein amplifying means comprise a determined number of amplifying modules each generating a voltage, of determined amplitude and phase, at the terminals of an output load.

5. Device according to claim 4, wherein an amplifying module comprises an "H" bridge symmetrical structure comprising four MOSFET transistors each distributed on each leg of the bridge operating under blocking switching conditions, each receiving on their grid a radiofrequency control signal and whose power supply is controlled by an activation or non-activation control.

6. Device according to claim 3, wherein means for generating the phase modulation controls comprise, at least a first and second digital processing circuit of modulation signal determining respectively the value of the phase shift to be applied respectively to the first and second output signal of a first and second determined number of amplifying modules of amplifying means as a function of the amplitude of modulation signal, a buffer register to synchronize the phase modulation data items coming respectively from the two digital processing circuits, at least a first and second digital oscillator generating respectively from the same determined clock signal a periodic digital signal varying sinusoidally with the transmission frequency of the signal to be modulated and whose phase varies according to the phase modulation control according respectively from the two digital processing circuits, coupled respectively to a digital-to-analog converter whose output is coupled to a filter, to deliver at the output, respectively, a control signal of determined phase as a function of the amplitude of modulation signal and of identical frequency to transmission frequency.

7. Device according to claim 3, wherein the management means comprise a sequence processing circuit, each sequence being defined as a portion of modulation signal, receiving on a first input the digitally converted modulation signal and delivering at output respective information items for the slope of modulation signal at the current moment and at the preceding moment, respective information items for the identification of the first and last activated module at each change of slope of modulation signal, these information items being reinjected on its other inputs, and further delivering a first pair of respective information items for the identification of the module elected by processing circuit and for the phase to be applied to the elected module, and a second pair of respective information items for the identification of the module elected and for the slope of the modulation signal, a phase decoder and an ON/OFF state decoder receiving respectively the first and second pair of information items, and a buffer register to synchronize the information items decoded by the two decoders and delivering respectively a determined control word to a multiplexer and a determined control word of the amplifier stage.

8. Device according to claim 3, wherein means for adding the output signals of amplifying means comprise at least two transformers whose primaries receive respectively the output signals of the first and second determined number of modules and whose secondaries are wired in series, a first end being connected to a reference potential and a second end being connected to the input of filtering means.

* * * * *